United States Patent [19]
Krausse, III

[11] Patent Number: 5,640,045
[45] Date of Patent: Jun. 17, 1997

[54] THERMAL STRESS MINIMIZATION IN POWER SEMICONDUCTOR DEVICES

[75] Inventor: George J. Krausse, III, Fort Collins, Colo.

[73] Assignee: Directed Energy, Inc., Ft. Collins, Colo.

[21] Appl. No.: 597,679

[22] Filed: Feb. 6, 1996

[51] Int. Cl.$^6$ .................... H01L 23/06; H01L 23/15
[52] U.S. Cl. .................... 257/705; 257/633; 257/706; 257/747
[58] Field of Search .................... 257/633, 705, 257/706, 747

[56] References Cited

U.S. PATENT DOCUMENTS

| | | | |
|---|---|---|---|
| 3,644,798 | 2/1972 | Ihochi | 257/706 |
| 3,769,560 | 10/1973 | Miyake et al. | 257/706 |
| 4,172,261 | 10/1979 | Tsuzuki et al. | 257/706 |
| 4,651,192 | 3/1987 | Matsushita et al. | 257/706 |
| 4,729,010 | 3/1988 | Tsuchiya et al. | 257/706 |
| 4,965,659 | 10/1990 | Sasame et al. | 257/706 |

*Primary Examiner*—Mahshid D. Saadat
*Assistant Examiner*—Teresa M. Arroyo
*Attorney, Agent, or Firm*—Dean P. Edmundson

[57] ABSTRACT

A packaging system for minimizing thermal-induced stress in a high power semiconductor device. The system is comprised of an electrically insulating, thermally conductive substrate having planar upper and lower surfaces, a semiconductor die having a planar lower heat extraction surface attached to said upper surface of said substrate, and electrically insulating thermal compound disposed between and in contact with the said lower heat extraction surface of said substrate and the system heat extraction upper surface. $\Delta L \propto \Delta S$ is defined in Equation 12, wherein $T_B$ is the temperature at said outer edge of the lower heat extraction surface of said die, $T_D$ is the temperature at said outer edge of the lower surface of said substrate, and PPM is part per million.

6 Claims, 5 Drawing Sheets

THERMAL STRESS MINIMIZATION IN POWER SEMICONDUCTOR DEVICES

FIELD OF INVENTION

This invention relates generally to high power semiconductor devices. More particularly, this invention relates to reducing and minimizing thermal stress in such devices which is induced when operating the devices at high power.

BACKGROUND OF THE INVENTION

The power cycling of high power semiconductor devices operating at a large percentage of their power handling capability is extremely stressful on the materials of which the device is constructed. The typical high power device will only complete a few thousand power cycles when operated at 100% of its rated power. Operating at this power level implies that the change in temperature ($\Delta T$) from junction to heat sink is on the order of 125° C. This fact limits the practical operating range for acceptable life to approximately a $\Delta T$ of 25° to 50° C. The net result is a substantial increase in the cost-per-watt of power conditioning systems, increased system size and lower efficiency. All of these are inconsistent with the needs of industrial power electronics and its technology vector. For the purposes of general discussion herein, the power MOSFET is referred to as a generic high power high frequency device.

It is shown in FIG. 1, and it was designed in the 1950s to hold a pair of semiconductor diodes as a replacement for a vacuum tube rectifier. The bolt pattern is the same as an octal tube socket bolt pattern and the two pins (gate and source) fit the pin 2 and pin 7 location for that same socket. For many years this was the ultimate high power solid state device package. Unfortunately, virtually every aspect of this package is at variance with what is required for modern high power high frequency devices. The two pins which provide highly inductive, 20–30 nH, connections to the interior of the package exit into the heat sink. This has never been a good topology for a high power high speed device. The case (drain), by default, is electrically a very active node, thus requiring an electrical insulator which causes a loss of thermal performance. The case (drain) aspect of this topology also creates a large drain to ground parasitic capacitance. The mismatch in Thermal Coefficient of Expansion (TCE) is large, often requiring buffering materials further degrading the thermal performance.

Furthermore I have observed that there are three factors which combine to cause warping of the package and a loss of thermal contact and therefore an increase in temperature and mechanical die stress as well as a further loss in power handling capability. They are as follows; (1) the package 12 is rigidly attached to the heat sink 15 with the two screws as shown in FIG. 1; (2) the heat sink and the device case are made of different materials with very different TCEs, and (3) the applied power which induces a substantial thermal gradient, $\Delta T$. The die 10 is attached to the upper surface of package 12 by solder 11. An insulator 13 is disposed between the package 12 and the heat sink 15. A thermal compound 14 is disposed on the upper surface of the heat sink. Warping of the package 12 results in a gap or void 16 as shown in FIG. 1.

Approximately thirty years after the development of the device of FIG. 1, a modern RF 0.5 in. flange package shown in FIG. 2. The resemblance to the device of FIG. 1 is clear. Although this package is much less inductive (3–6 nH), it suffers from many of the same mechanical and thermal shortcomings. The die 10 is soldered to a thick BeO substrate 12A (0.064 in. thick). The BeO is attached to a thick copper foot 12B (0.097 in. thick). This results in two solder layers, a thick BeO layer, a thick copper layer, and finally a thin layer of thermal compound 14. As with the device of FIG. 1, the heat sink attachment method also has the potential for warping the case. This is mitigated by the thick BeO layer. However, the penalty for this is a substantial increase in the thermal resistance junction to heat sink ($R_{\theta JHS}$) and a commensurate drop in power handling capability.

There has not heretofore been provided a packaging system for high-power semiconductor devices which minimizes or reduces thermal induced stress which results from high-power operation, which also increases power handling capability.

SUMMARY OF THE INVENTION

In accordance with the present invention there is provided a packaging system for high-power semiconductor devices which overcomes the problems inherent in the prior art devices. The new packaging system provides for high-power dissipation while offering greatly-reduced thermal induced stress and thermal resistance junction to heat sink. The new packaging system also provides a less cumbersome mounting technique than has been used in prior art devices.

The system of the invention enables an increase in the power-handling capability of a high-power device while at the same time lowering the stress level and the $R_{\theta JHS}$ and increasing the power-cycling capability.

The packaging system of this invention utilizes controlled thicknesses of the semiconductor die and the substrate to which it is attached, while also maintaining intimate contact between the heat extraction surface of the device and the heat sink. The thermal compound between the device and the heat sink is selected to provide high thermal conductivity while remaining electrically insulating.

The other advantages and features of the system of this invention will be apparent from the following detailed description and accompanying drawings.

BRIEF DESCRIPTION OF THE INVENTION

The invention is described in more detail hereinafter with reference to the accompanying drawings wherein like reference characters refer to the same parts throughout the several views and in which.

Figure 3:
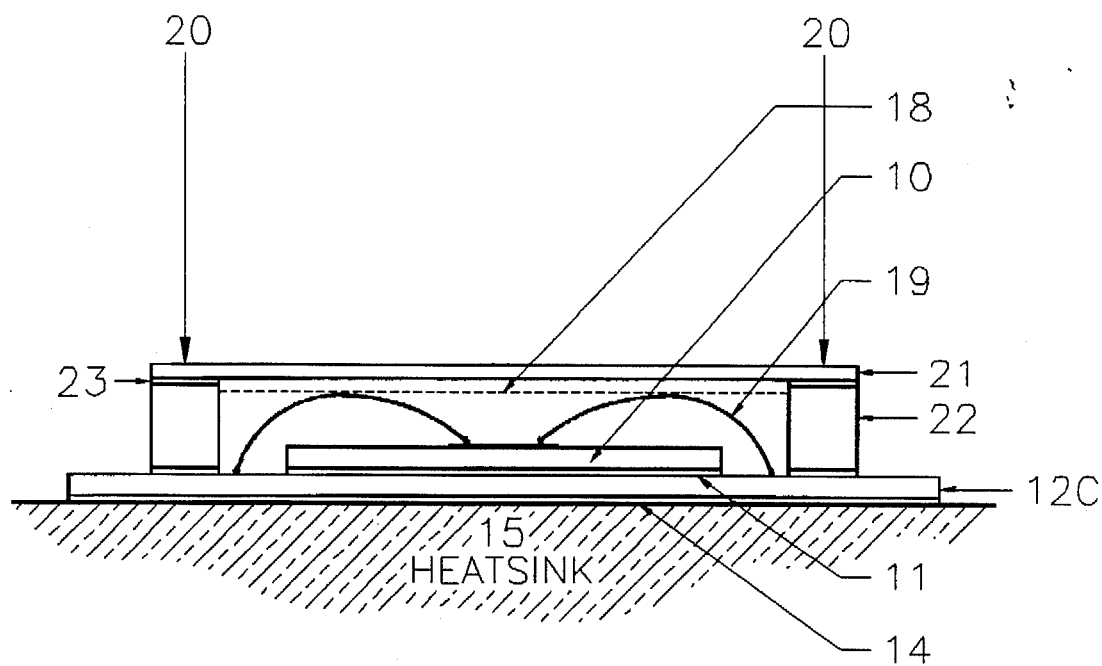
Figure 4:
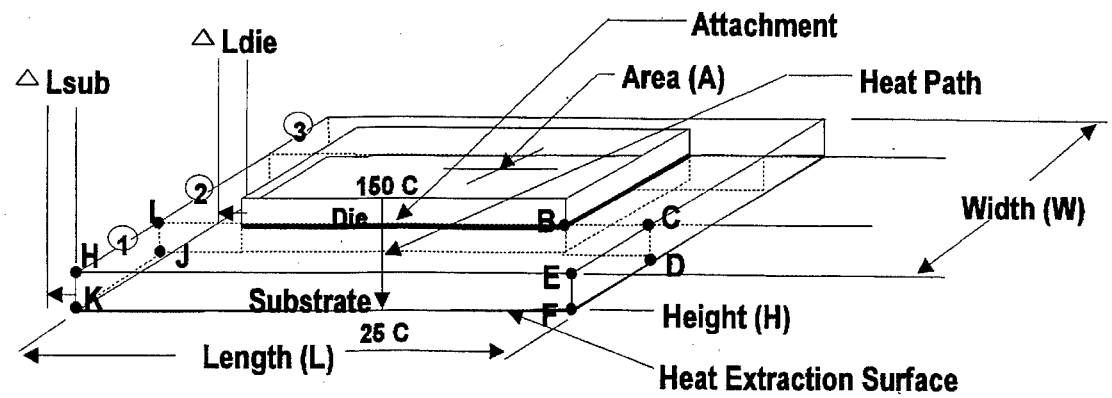
Figure 5:
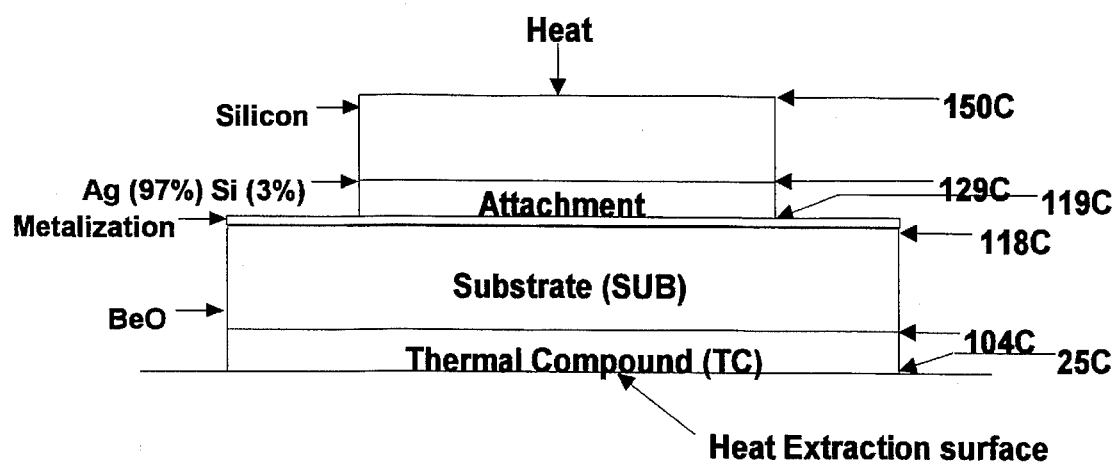
Figure 6:
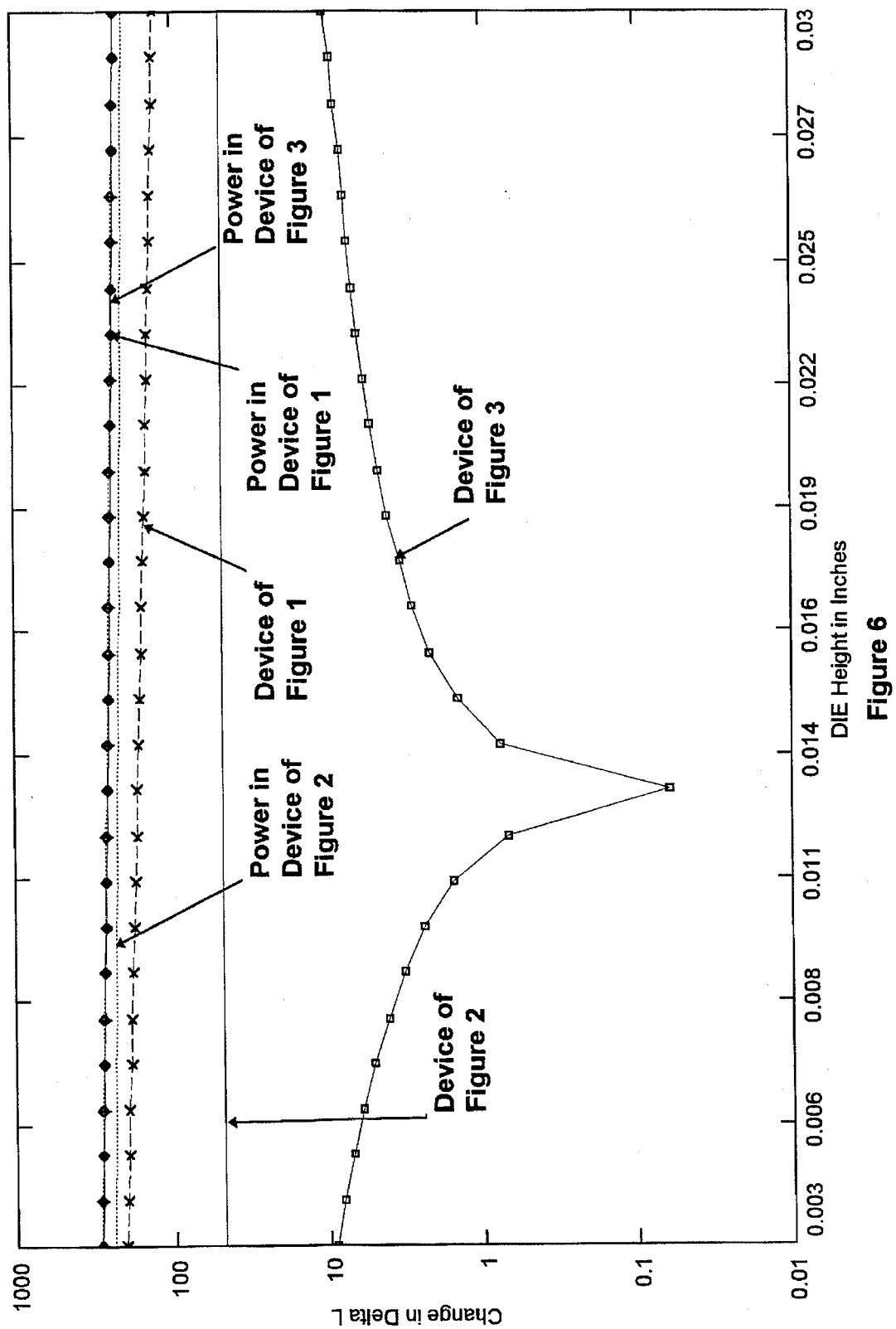
Figure 7:
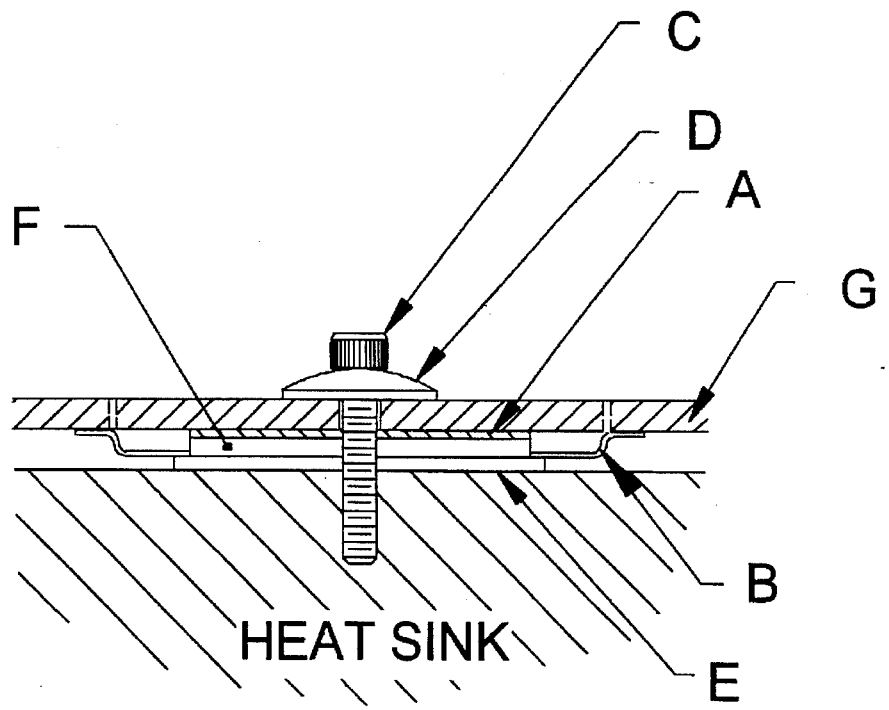

FIG. 3 is a high power device incorporating features of this invention; the die 10 is attached to BeO substrate 12C with solder 11; wire(s) 19 connect the die 10 substrate 12C; AlO₃ window frame 22 and lid 21 cover the die 10, with an epoxy seal 23 between the lid 21 and frame 22; silicone gel 18 is disposed over the die 10; compression force 20 is applied as shown;

FIG. 4 is a schematic view of the device of FIG. 3;

FIG. 5 is a side elevational view of a device of the invention;

FIG. 6 is a graph of Equation 12; where the die surface temperature was maintained at 150° C., all mechanical dimensions are equal for the three devices, and all nonvariant physical constraints are equal for the three devices;

FIG. 7 illustrates the preferred mounting technique of the invention from a side view, where F is the device of FIG. 3, C is a socket head screw, D is a belleville washer, A is a silicone rubber pad, G is a printed circuit board, B is a stress relief bend, and E is a thermal compound.

Figure 8:
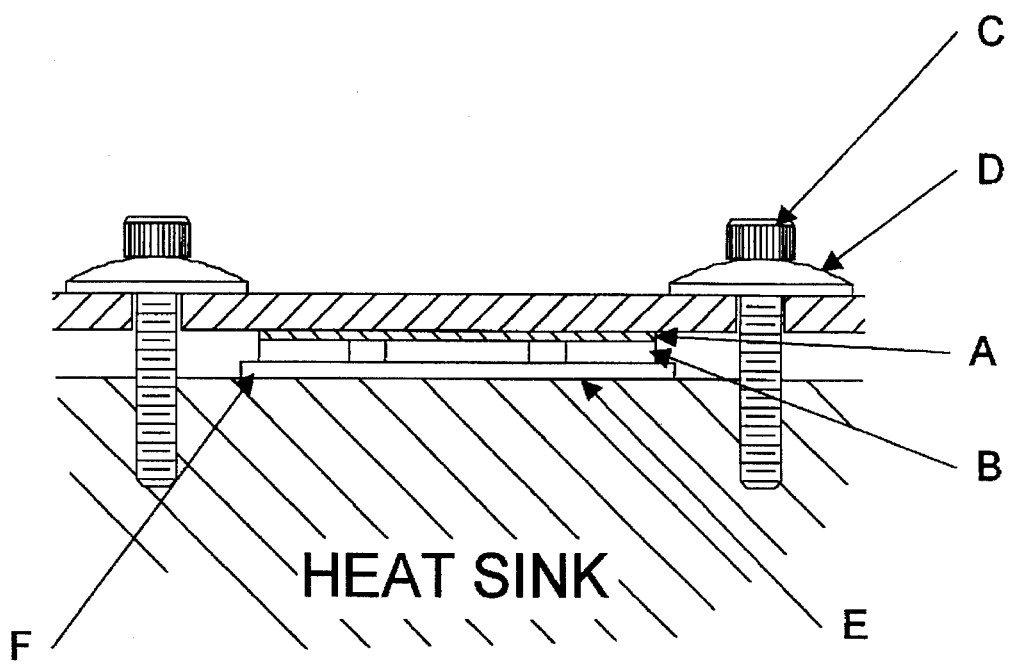

FIG. 8 illustrates the preferred mounting technique of the invention from a end view.

For the purposes of this discussion reference is made to the use of the power MOSFET as a generic high power high frequency device. However the following techniques are also applicable to a host of other high power devices. This list includes but is not limited to bipolar transistors (BJT), laser diodes, insulated gate bipolar transistors, (IGBT), static induction transistors, (SIT), bulk avalanche semiconductor switches, (BASS), silicon control rectifiers, (SCR) and power semiconductor diodes. The semiconductor die could also be made of a variety of materials including but not limited to; silicon, gallium-arsenide and silicon-carbide.

There are five interrelated topics which it will be necessary to discuss in order to obtain a clear understanding of the operative terms and the forcing functions. They are: number of layers, material and material height, $\Delta T$ composition, contact area and thermal compound.

Number of Layers

Figure 1:
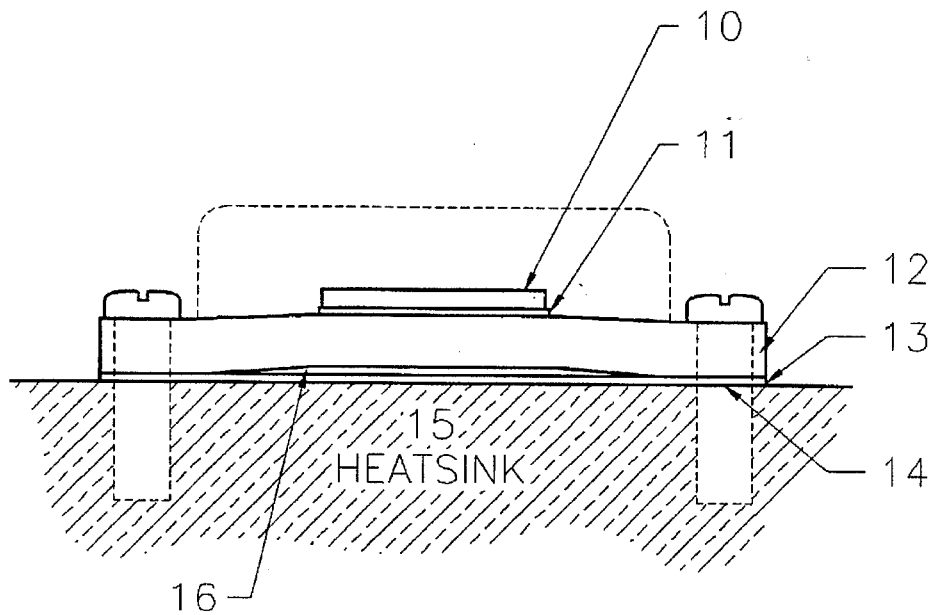
FIG. 1 is a prior art high power device.
Figure 2:
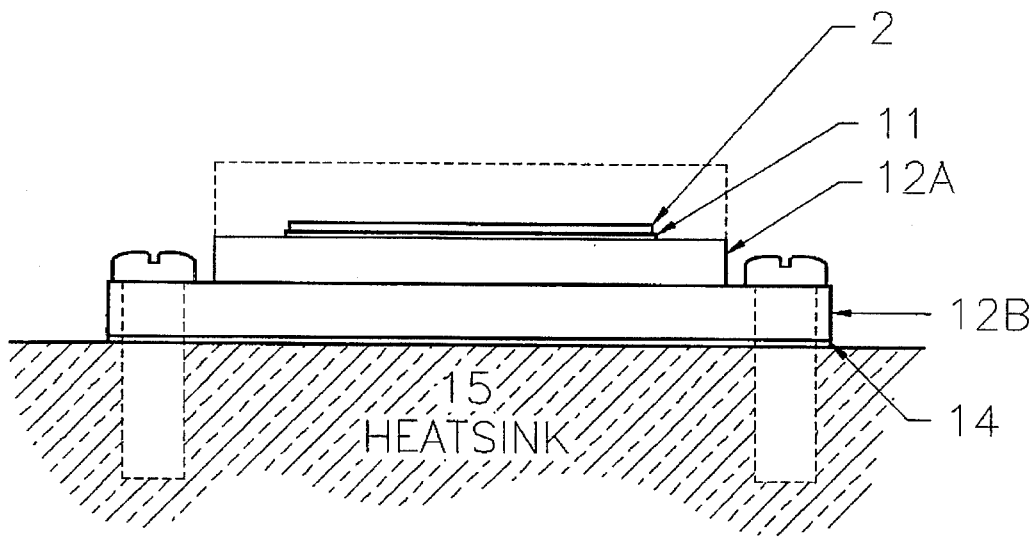
FIG. 2 is another prior art high power device.

The thermal impedance junction to heat sink, $R_{\theta JHS}$, for the three devices we have discussed thus far is given by Equation 1, for the device of FIG. 1, Equation 2, for the device of FIG. 2 and Equation 3, for the present invention. These equations include all the significant terms which constitute $R_{\theta JHS}$.

$$R_{\theta JHS} = R_{\theta(DIE)} + R_{\theta(ATTACH)} + R_{\theta(CU\text{-}SUB)} + R_{\theta(TC)} + R_{\theta(INS)} + R_{\theta(TC)} \quad 1$$

$$R_{\theta JHS} = R_{\theta(DIE)} + R_{\theta(ATTACH)} + R_{\theta(METAL)} + R_{\theta(BeO\text{-}SUB)} + R_{\theta(METAL)} + R_{\theta(ATTACH)} + R_{\theta(CU\text{-}FOOT)} + R_{\theta(TC)} \quad 2$$

$$R_{\theta JHS} = R_{\theta(DIE)} + R_{\theta(ATTACH)} + R_{(METAL)} + R_{\theta(BeO\text{-}SUB)} + R_{\theta(TC)} \quad 3$$

From a casual inspection of the three equations we see that the device of FIG. 3 has only 5 terms while the other two each have 6 and 8 terms; for other devices this number can be even higher. If we allow similar terms to have approximately an equivalent $R_\theta$ then fewer layers implies a lower net $R_{\theta JHS}$. This is illustrated by the approximate totals for Equations 1, 2 and 3.

Material and Material Height

FIG. 4 illustrates more schematically the typical make-up of the device of FIG. 3. The thermal gradient is also shown. The Thermal Coefficients of Expansion (TCE) of the respective layers of materials are different. Therefore, the change in stress is directly related to the operating temperature, and therefore the applied power level. We can see this in a simplistic way by examining Equation 4.

Delta Length, $\Delta L$, is the difference in the length of the die and the substrate due to the TCEs and the material temperature. Restraining the change in substrate length is the following: The die surface we will set at 150° C. (see FIG. 4.), point B, the outer edge of the lower surface of the die, is at a much lower temperature, the average die temperature is the average of the two. The substrate at point B has temperature $T_B$; as we move to point C, the outer edge of the upper surface of the substrate, the temperature, $T_C$, is much lower; and then as we move to point D, the outer edge of the lower surface of the substrate, the temperature, $T_D$, is very near the heat sink.

$$4. \quad \Delta L = [TCE_{DIE} \times L_{DIE} \times T_{DIE}] - \left[ \left[ [TCE_{SUB} \times L_{SUB} \times T_{SUB}] \times \left[ \frac{W_{DIE}}{W} \right] \right] + \left[ \left[ TCE_{SUB} \times L_{SUB} \times \left[ \frac{T_B + T_D}{2} \right] \right] \times \left[ \frac{W - W_{DIE}}{W} \right] \right] \right]$$

Where:

$TCE_{SUB}$=Thermal Coefficient of Expansion of the Substrate. (Range=4.0 to 10 PPM/°C.)

$L_{SUB}$=Length of the substrate in the heat flow path.

$T_{SUB}$=the average Temperature of the Substrate.

$TCE_{DIE}$=Thermal Coefficient of Expansion of the Die. (Range=4.0 to 10 PPM/°C.)

$L_{DIE}$=Length of the Die.

$T_{DIE}$=the average Temperature of the Die.

Referring to FIG. 4 volume ①  in the substrate, is defined by points E, C, D and F on one end and H, I, J and K on the opposite end. Volume ③ is defined in a similar manner and it is equal to volume ①. Their widths are given by $$\left[ \frac{W - W_{DIE}}{2} \right]$$

Both Volume ① and Volume ③ are at the temperature average of $T_B$, $T_O$, $T_D$. While the Volume ② as defined by the die size, $[W_{DIE}/W]$ is at a temperature average of $T_B$, $T_D$.

Therefore since the height and length for each of the volumes in the substrate is equal, the change in the length is reduced by their relationship to the total width (W) and the difference in temperature. As Volume ② attempts to expand, it is restrained by Volume ① and Volume ③. At the same time the die is also expanding, as illustrated by the first term of Equation 4, $[TCE_{DIE} \times L_{DIE} \times T_{DIE}]$.

From this simplistic approximation we see that as we increase the Temperature (T) the $\Delta L$ term increases. As the two materials expand to different lengths, $\Delta L_{DIE}$ and $\Delta L_{SUB}$, the stress also increases. It is this Delta Stress, $\Delta S$, that is the primary cause of substrate or die power cycling failure.

$\Delta T$ Composition

To better understand the forcing functions, operating on $\Delta T$ its non-isotropic profile and the effect on $\Delta L$, and therefore $\Delta S$, let us look at the terms which comprise this element of the equation.

The change in temperature across a material is given by:

$$\Delta T_{(MATERIAL)} = P \times R_\theta$$

Where:

P=Power in watts (W)

$R_\theta$=Thermal Resistance (°C./W)

And $R_\theta$ is given by:

$$6. \quad R_\theta = \frac{H}{K \times A}$$

Where:

K=thermal conductivity (W/°C.·M)

H=height of the material (M)

A=the cross-sectional area of heat flow (die surface) (M²)

Referring to Equations 5 and 6 and given that we have a fixed maximum junction temperature, $T_{MAX}$, to maximize power handling capability we must minimize $R_\theta$. The most straight forward term to optimize is the material Height, H.

Now combining equations 4, 5 and 6 we have $$7.\ \Delta T_{(MATERIAL)} = P \times \frac{H}{K \times A}$$

Recall that the composite $R_\theta$ for the device of FIG. 3 was given by Equation 3. Also recall that the power which passes through all layers is undiminished. If we combine Equation 7 and Equation 3 we have:

$$8.\ T_{MAX} = P \times \frac{H_{DIE}}{K_{DIE} \times A_{DIE}} + P \times \frac{H_{ATTACH}}{K_{ATTACH} \times A_{DIE}} +$$

$$P \times \frac{H_{METAL}}{K_{METAL} \times A_{DIE}} + P \times \frac{H_{SUB}}{K_{SUB} \times A_{DIE}} + P \times \frac{H_{TC}}{K_{TC} \times A_{DIE}}$$

The $T_{MAX}$ must also include the thermal offset of the heat sink temperature, $T_{HS}$. Adding $T_{HS}$ and re-arranging terms of the equation we have:

$$9.\ T_{MAX} = P \times \left( \frac{H_{DIE}}{K_{DIE} \times A_{DIE}} + \frac{H_{ATTACH}}{K_{ATTACH} \times A_{DIE}} + \frac{H_{METAL}}{K_{METAL} \times A_{DIE}} + \frac{H_{SUB}}{K_{SUB} \times A_{DIE}} + \frac{H_{TC}}{K_{TC} \times A_{DIE}} \right) + T_{HS}$$

$A_{DIE}$ is used for all layers, this is because the small value of H of the layers and the high rate of the heat flow at high power levels, $$>500 \frac{J}{s \cdot cm},$$

allows for very little heat spreading. If we insert typical values we get the thermal gradient illustrated in Table 1.

adjusting the position, Table 1, (1–5), material thermal conductivity, (K), height, (H) and cross-sectional area, (A) of one or all of the component parts. From this we see that for a given power level, P we can change the temperature, T. This in turn changes the $\Delta L$, recall Equation 4.

If we now let $\Delta L$ approach 1 PPM/°C., we have:

$$\Delta L = [TCE_{DIE} \times L_{DIE} \times T_{DIE}] -$$

$$\left[ \left[ [TCE_{SUB} \times L_{SUB} \times T_{SUB}] \times \left[ \frac{W_{DIE}}{W} \right] \right] \right] +$$

$$\left[ \left[ TCE_{SUB} \times L_{SUB} \times \left[ \frac{T_B + T_D}{2} \right] \right] \times \left[ \frac{W - W_{DIE}}{W} \right] \right] \to 1PPM/C$$

Given that $\Delta L \propto \Delta S$ then as $\Delta L$ approaches 1 PPM/°C., $\Delta S$ also approaches a minimum. This is the change in the stress from the quiescent to the maximum power level. We can reach this condition most easily by adjusting the values of $H_{SUB}$ and $H_{DIE}$ and accurately controlling the other terms of Equation 3. By minimizing $\Delta L$ and at the same time require that $R_\theta$ moves in a negative direction and that the power dissipation capability move in the positive direction. This allows us to maximize power while lowering $R_\theta$ and minimizing delta stress, $\Delta S$.

Using the preceding Equations 3 through 12 and an iterative program, (quiescent to high power) we can converge an the centroid of $\Delta L$1 PPM/°C. This process yields the die height, $H_{DIE}$, substrate height, $H_{SUB}$, to achieve minimum delta stress, $\Delta S$. It also provides the maximum power handling capability, $P_{MAX}$ of the device and the thermal resistance junction to heat sink, $R_{\theta JHS}$.

The graph of Equation 12 is illustrated in FIG. 6. From this we see that the device of FIG. 1 and the device of FIG. 2 show only a steady drop in power handling capability as the DIE height is increased from 0.002 in. to 0.032 in., whereas the device of FIG. 3 shows a sudden drop in $\Delta L$ as

TABLE 1

| $T_{MAX} =$ | $\Delta T_{DIE} +$ | $\Delta T_{ATTACH} +$ | $\Delta T_{METAL} +$ | $\Delta T_{SUB} +$ | $\Delta T_{TC} +$ | $T_{HS}$ |
|---|---|---|---|---|---|---|
| 150° C. = | 19.48° C. + | 10.69° C. + | .89° C. + | 14.05° C. + | 79.26° C. + | 25° C. |
| $T_{MAX} =$ | $T_5 +$ | $T_4 +$ | $T_3 +$ | $T_2 +$ | $T_1 +$ | $T_{HS}$ |

The thermal gradient of the device of FIG. 3 is illustrated in FIG. 5. Each layer has a starting temperature and as a result of the input power a subsequent $\Delta T$, which together provide the starting temperature for the next layer. For our discussions we will use the average temperature for the layers of interest. For the average die temperature we have:

$$10.\ T_{DIE} = \frac{T_{(DIE-TOP)} + T_{(DIE-BOTTOM)}}{2} =$$

$$\frac{T_{MAX} + (T_4 + T_3 + T_2 + T_1 + T_{HS})}{2} = 140° C.$$

and for the average substrate temperature we have:

$$11.\ T_{SUB} =$$

$$\frac{T_{(SUB-TOP)} + T_{(SUB-BOTTOM)}}{2} = \frac{T_2 + (T_1 + T_{HS})}{2} = 111° C.$$

Note that the temperatures are both position and material sensitive. Therefore we can adjust the thermal profile by the height approaches 0.0013 in and the substrate is at ~0.040 in. If we select heights for the die and the substrate which are less than one sigma from the minimums and let all terms vary, to their maximum limits of reasonable fabrication tolerances, in the direction that increases the $\Delta S$, we still see a factor of 100 reduction in $\Delta L$ and a substantial improvement in the number of power cycles over the prior art of FIGS. 1 and 2.

Contact Area

In order to control the terms of Equation 3 thus preserving the high power handling capability, low thermal impedance and low stress, the package design must be capable of maintaining intimate contact between the heat extraction surface of the package and the heat sink, and also allow the device to expand in X (width of heat sink), Y (length of heat sink), and Z (normal to heat sinking surface). FIG. 7, the side view and FIG. 8 the end view, illustrates how this is accomplished in the device of FIG. 3.

(A) A silicone rubber pad is inserted between the top of the device case and the bottom of the PCB. This provides local compliance for small variations in the package and the PCB.

(B) The leads are bent up and soldered to the bottom side of the PCB. This allows the device to be removed from the heat sink with the PCB. The leads of the device are made of 99.9% pure copper with the grain structure aligned in the direction of the lead length, producing an extremely soft lead. This, along with the stress relief bend, provides excellent lead compliance and offers low stress to the package seals.

(C) Two screws pass through the PCB on either side of the device, and place it in compression. (A), (B), and (C) provide X and Y compliance.

(D) Belleville washers and (A) provide vertical compliance and maintain an even pressure on the device. This allows vertical Z expansion with no loss of contact.

(E) The heat sink side of the BeO substrate of the device has been ground flat to within ±0.0005 inch per linear inch, providing an average contact area of 77% and a thermal compound is applied for optimal thermal contact with the heat sink.

This technique minimizes package deformation and variations in mounting the device to the heat sink and thus preserving a constant contact area.

Thermal Compound

The thermal compound is the single largest component of the $R_\theta$ term, this is clearly illustrated in Equation 9, Table 1 and FIG. 5. This condition is true for all devices.

After in depth research and product development in the area of thermal compounds, we found that the density and to a lesser degree the thermal conductivity are the most important terms. The mixtures with the lower density materials gave the best performance. The most optimum would be a material with a density approaching that of the oil, (<1.0 gm/cm$^3$), and with a high thermal conductivity. For example aluminum (AL) with a density of (2.7 gm/cm$^2$) in powder form with a grain size of 1–4 μin. would be the best choice from a thermal conductivity perspective. However this would create a thermal compound which is electrically conductive. This could present problems for both manufacturing and field service.

The preferred thermal compound offers ~50% improvement over the generic zinc oxide, (ZnO, D=5.06 gm/cm$^3$) thermal compound, with a thermal conductivity of ~0.008° C./cm W. The thermally conductive medium in the thermal compound is aluminum nitride, (ALN, D=3.25 gm/cm$^3$) powder (DOW XUS 35548) with a particle size of 3–4 μin. which has a thermal conductivity approaching aluminum and is an outstanding electrical insulator. This powder is then mixed with DOW 200 silicone oil, with a viscosity of 50 cSt. as a binder and wetting agent, The mixing ratio is 30.0 gr. of aluminum nitride to 10.0 gr. of silicone oil. This yields a conductive medium to oil loading factor of 75.0%, by weight and a Thermal conductivity of ~0.012° C./cm W. The mixture is then placed in a vacuum for approximately one hour to remove air trapped in the mixture by the mixing process.

Therefore, it is only when using the mounting technique described herein in combination with minimizing the number of layers, selecting materials with low thermal impedance and with thermal coefficients of expansion (TCE) approaching but not equal to silicon and adjusting their thickness, such that Equation 130, that we can assemble a multi-layer configuration that provides low thermal impedance ($R_\theta$), low delta stress ($\Delta S$), and high power handling capability ($P_{MAX}$). This technique gives the devices an $R_{\theta JHS}$ 2 to 4 times lower and a maximum power handling capability that is 2 to 4 times higher than any power MOSFET device with equal die size while reducing the $\Delta S$ by a factor of 2–3. The technique of this invention thus involves symmetrically balancing the non-isotropic mechanical expansion, induced by power dissipation, so that $\Delta S$ approaches zero.

Other variants are possible without departing from the scope of this invention.

What is claimed is:

1. A packaging system for minimizing thermal-induced stress in a high power semiconductor device, the system comprising:

(a) an electrically insulating, thermally conductive substrate having planar upper and lower surfaces, wherein said lower surface includes a heat extraction surface and an outer edge, wherein said substrate has a thermal expansion coefficient $TCE_{SUB}$, a length $L_{SUB}$, and a width W;

(b) a semiconductor die having a planar lower heat extraction surface attached to said upper surface of said substrate, wherein said heat extraction surface includes an outer edge; wherein said die has a thermal expansion coefficient $TCE_{DIE}$, a length $L_{DIE}$ and a width $W_{DIE}$;

(c) electrically insulating thermal compound disposed between and in contact with said lower heat extraction surface of said substrate and the system heat extraction upper surface;

wherein $$\Delta L = [TCE_{DIE} \times L_{DIE} \times T_{DIE}] - \left[ \left[ [TCE_{SUB} \times L_{SUB} \times T_{SUB}] \times \left[ \frac{W_{DIE}}{W} \right] \right] + \left[ \left[ TCE_{SUB} \times L_{SUB} \times \left[ \frac{T_B + T_D}{2} \right] \right] \times \left[ \frac{W - W_{DIE}}{W} \right] \right] \right] \rightarrow$$

wherein $T_B$ is the temperature at said outer edge of the lower heat extraction surface of said die, $T_D$ is the temperature at said outer edge of the lower surface of said substrate, and PPM is part per million.

2. A packaging system in accordance with claim 1, wherein said substrate comprises beryllium oxide.

3. A packaging system in accordance with claim 1, wherein said die comprises silicon dioxide.

4. A packaging system in accordance with claim 1, wherein said substrate has a width in the range of 0.375 to 1.0 inch, a length in the range of 0.375 to 1 inch, and thickness in the range of 0.25 to 0.55 inch.

5. A packaging system in accordance with claim 4, wherein said substrate has a thermal coefficient of expansion in the range of 3 to 7 PPM/°C.

6. A packaging system for minimizing thermal-induced stress in a high power semiconductor device, the system comprising:

(a) an electrically insulating, thermally conductive substrate having planar upper and lower surfaces, wherein said substrate has a thermal expansion coefficient $TCE_{SUB}$, a length $L_{SUB}$, and a width W;

(b) a semiconductor die having a planar lower heat extraction surface attached to said upper surface of said substrate, wherein said die has a thermal expansion coefficient $TCE_{DIE}$, a length $L_{DIE}$ and a width $W_{DIE}$;

(c) electrically insulating thermal compound disposed between and in contact with said heat extraction surface of said die and said upper surface of said substrate; and (d) a heat sink in thermal communication with said lower surface of said substrate;

wherein $$\Delta L = [TCE_{DIE} \times L_{DIE} \times T_{DIE}] -$$
$$\left[ \left[ [TCE_{SUB} \times L_{SUB} \times T_{SUB}] \times \left[ \frac{W_{DIE}}{W} \right] \right] + \left[ \left[ TCE_{SUB} \times L_{SUB} \times \left[ \frac{T_B + T_D}{2} \right] \right] \times \left[ \frac{W - W_{DIE}}{W} \right] \right] \right] \rightarrow 1 PPM/C$$

wherein $T_B$ is the temperature at said outer edge of the lower heat extraction surface of said die, $T_D$ is the temperature at said outer edge of the lower surface of said substrate, and PPM is part per million.

\* \* \* \* \*